(12) United States Patent
Sakai

(10) Patent No.: US 6,306,778 B1
(45) Date of Patent: Oct. 23, 2001

(54) SUBSTRATE PROCESSING METHOD

(75) Inventor: Koji Sakai, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/651,284

(22) Filed: Aug. 30, 2000

(30) Foreign Application Priority Data

Aug. 31, 1999 (JP) .................................................. 11-244427

(51) Int. Cl.$^7$ ................................................... H01L 21/469
(52) U.S. Cl. .......................... 438/782; 438/778; 438/780; 438/790
(58) Field of Search ..................... 438/778, 780, 438/781, 782, 787, 790

(56) References Cited

U.S. PATENT DOCUMENTS

| | | | |
|---|---|---|---|
| 6,022,812 | * | 2/2000 | Smith et al. .......................... 438/761 |
| 6,048,804 | * | 4/2000 | Smith et al. .......................... 438/790 |

FOREIGN PATENT DOCUMENTS

| | | | |
|---|---|---|---|
| 911875-A2 | * | 4/1999 | (EP) . |
| 11 251311 | | 9/1999 | (JP) . |
| 11-274059 | | 10/1999 | (JP) . |
| 11-274248 | | 10/1999 | (JP) . |
| 2000-138210 | | 5/2000 | (JP) . |
| WO-98/47177 | * | 10/1998 | (WO) . |
| WO-00/08679 | * | 2/2000 | (WO) . |

* cited by examiner

*Primary Examiner*—Trung Dang
(74) *Attorney, Agent, or Firm*—Rader, Fishman & Grauer, PLLC

(57) ABSTRACT

When aging processing is performed, a ratio of water vapor contained in a processing gas is made comparatively large for a certain period of time from start of the processing, whereby it is accelerated for collides of TEOS to be gelled and chained in a network form, so that heating is further uniformly performed for the wafer W. Thereafter, the ratio of water vapor in the processing gas is decreased, so that a water content which is contained in the insulating film material after the aging processing can be reduced in amount.

17 Claims, 14 Drawing Sheets

SUBSTRATE PROCESSING METHOD

BACKGROUND OF THE INVENTION

1. Field of the Invention

The present invention is included in a technical field of processes of semiconductor device fabrication and the like, and more specifically, relates to, for example, a substrate processing method for performing gelling processing when a coating film in a sol form in which particles or colloids are dispersed in an organic solvent applied on a substrate as an insulating film material.

2. Description of the Related Art

In processes of semiconductor device fabrication, a layer insulating film is formed, for example, by an SOD (Spin on Dielectric) system. In this SOD system, a layer insulating film is formed by coating a wafer with a coating film while spinning the wafer and performing chemical processing, heat processing, or the like for the wafer by means of a sol-gel process or the like.

When a layer insulating film is formed by the sol-gel process, for example, first an insulating film material, for example, a solution in which colloids of TEOS (tetraethoxysilane) are dispersed in an organic solvent is supplied onto a semiconductor wafer (hereinafter referred to as "wafer"). Then, the wafer to which the solution has been supplied is subjected to gelling processing, and then solvents are exchanged. Subsequently, the wafer on which the exchange of solvents has been performed is subjected to heat processing.

In the process in which the wafer is subjected to gelling processing (aging processing) out of these series of processes, the wafer is subjected to heat processing at a temperature of, for example, about 100° C. on a hot plate in a processing chamber which is configured such that a processing gas made by mixture of, for example, ammonia gas and water vapor is exhausted while being supplied. Since water vapor is contained in the processing gas as described above, colloids of TEOS contained in a coating film applied as an insulating film material are gelled to be chained in a network form. The coating film immediately after the gelling contains water. After the water in the coating film is exchanged for another solvent, the solvent is removed to dry the coating film, thereby obtaining an insulating film. Alternatively, the water in the coating film is removed to dry the coating film, thereby obtaining an insulating film. There is a disadvantage that such removal of the water in the coating film requires very long total processing time.

Hence, to solve the above disadvantage, it is conceivable to reduce a ratio of water vapor contained in the processing gas by way of example. However, in that case, a reaction speed for collides of TEOS to be gelled and chained in a network form reduces, thereby bringing about a disadvantage that time required for the aging processing becomes lengthy. Further, water functions as a heat transmission medium for transmitting heat from the hot plate to the wafer during the heating. Therefore, if water is limited, there arises ununiformity in heat which is transmitted from the hot plate to the coating film applied on the wafer, resulting in occurrence of projections and depressions on the surface of the formed layer insulating film. Consequently, the projections and depressions cause insulation failure or the like in wiring which is formed thereon.

SUMMARY OF THE INVENTION

The present invention is made under the aforesaid circumstances and an object thereof is to provide a substrate processing method capable of uniformly performing heating for a substrate while a processing time is shortened.

To attain the above object, in a first aspect of the present invention provided is a substrate processing method comprising the steps of: heating a substrate while a processing gas made by mixture of an alkaline gas and water vapor is introduced into a processing chamber in which the substrate is placed; and decreasing a ratio of water vapor in the processing gas after a lapse of a predetermined period of time from the processing gas is introduced into the processing chamber.

According to the above structure, water content which is contained in the coating film which has been exposed to the processing gas can be reduced in amount, so that the processing time necessary for removing the water can be shortened.

In a second aspect of the present invention provided is a substrate processing method comprising the steps of: introducing an alkaline processing gas with water into a processing chamber in which a substrate coated with a coating solution in which particles or colloids are dispersed in a solvent is placed; and decreasing a ratio of water vapor in the processing gas after a lapse of a predetermined period of time from the processing gas is introduced into the processing chamber.

According to the above structure, it is accelerated for particles or collides contained in the coating film to be gelled and chained in a network form, so that heating is further uniformly performed for the wafer W. Further, water content which is contained in the coating film which has been exposed to the processing gas can be reduced in amount, so that the processing time necessary for removing the water can be shortened.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, the preferred embodiments of the present invention will be described below with reference to the drawings.

Figure 1:
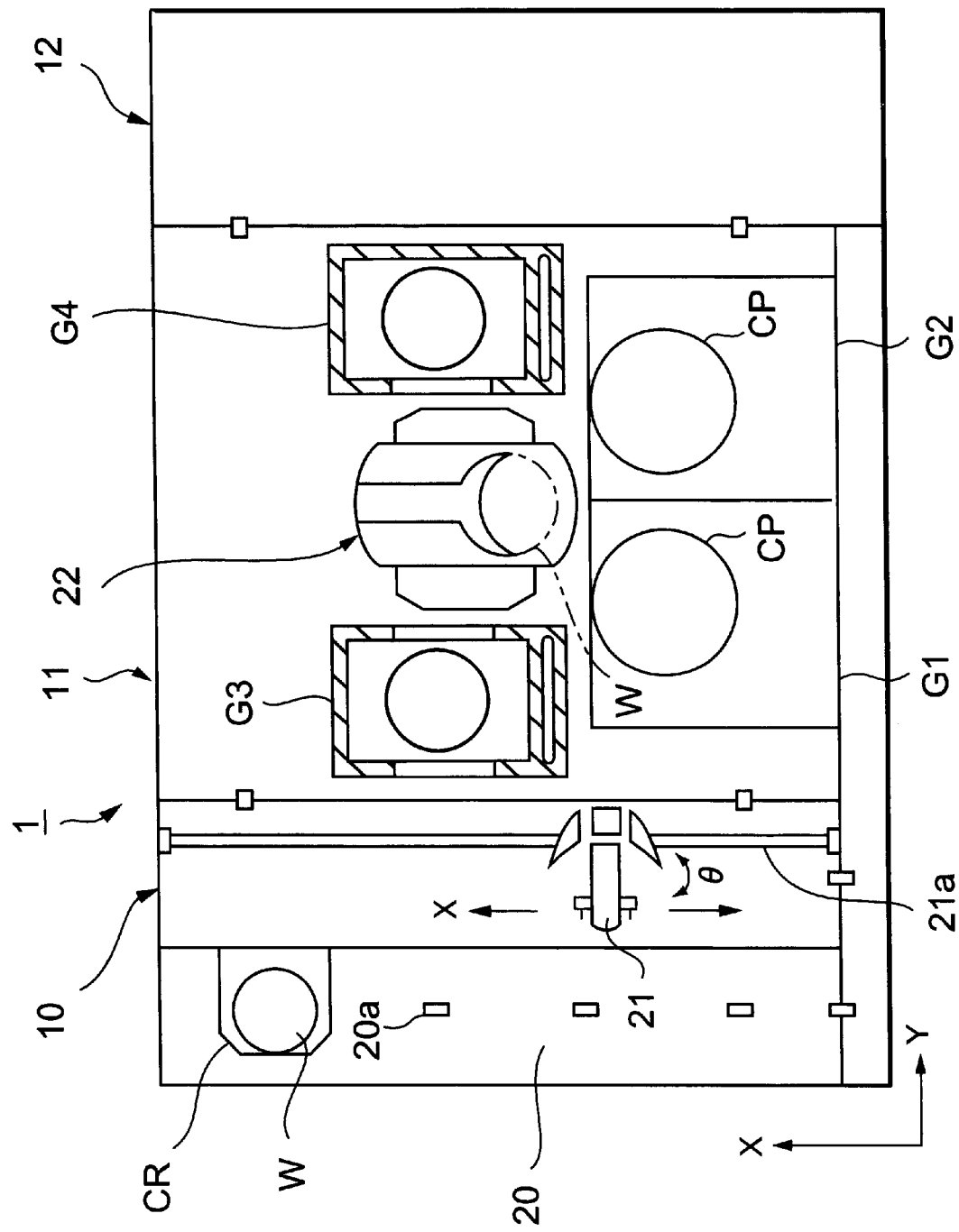
FIG. 1 is a plan view of an SOD processing system according to an embodiment of the present invention.
Figure 2:
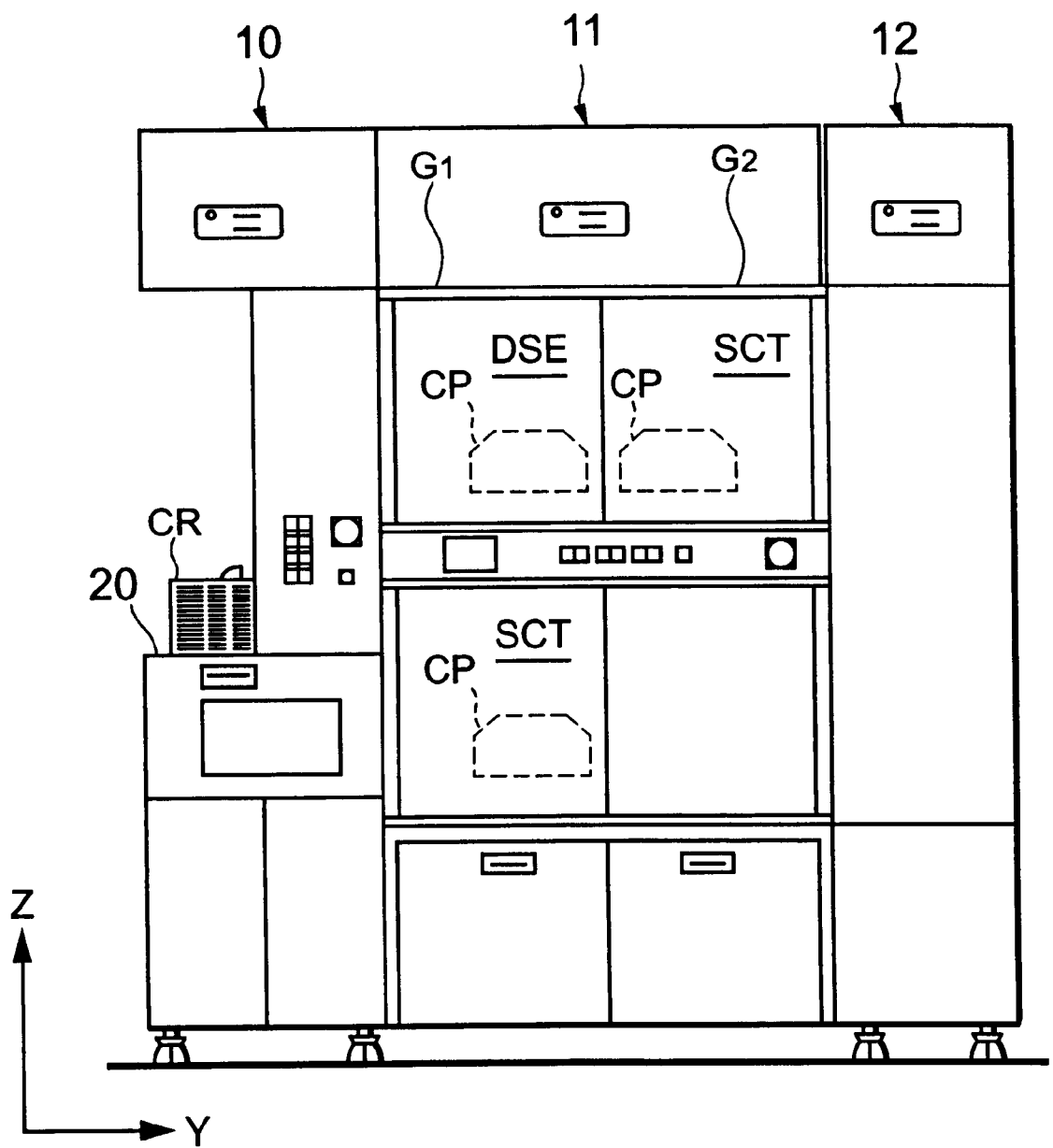
FIG. 2 is a front view of the SOD processing system shown in FIG. 1.
Figure 3:
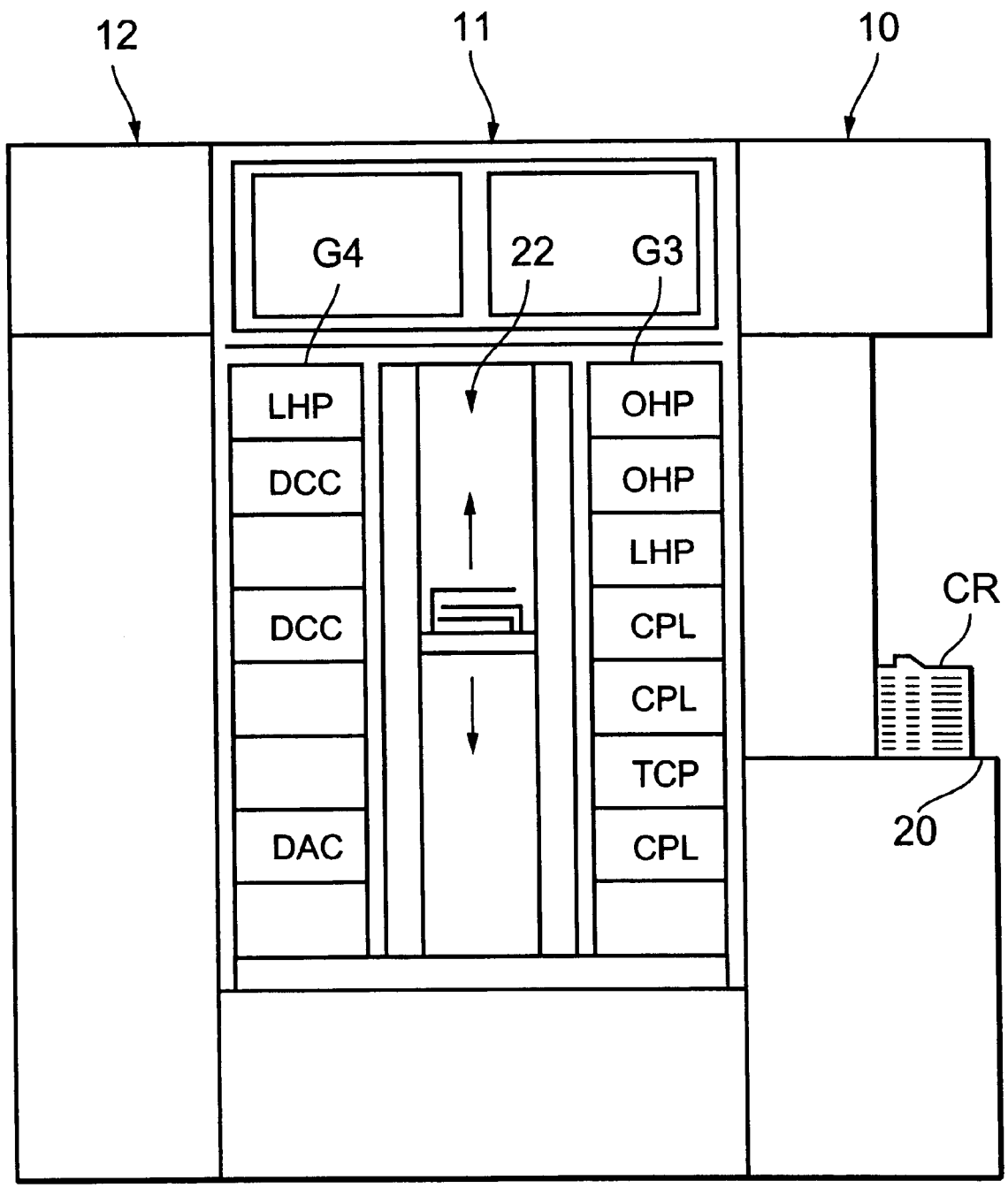
FIG. 3 is a rear view of the SOD processing system shown in FIG. 1.

In this embodiment, a substrate processing method of the present invention is applied to an SOD (Spin on Dielectric) processing system for forming a layer insulating film on a wafer. FIG. 1 to FIG. 3 are views showing the entire structure of the SOD processing system, FIG. 1 is a plan view, FIG. 2 is a front view, and FIG. 3 is a rear view.

The SOD processing system 1 has a structure in which a cassette block 10 for transferring a plurality of, for example, 25 semiconductor wafers (hereinafter, referred to as wafers) W as substrates, as a unit, in a wafer cassette CR from/to the outside into/from the system and carrying the wafer W into/out of the wafer cassette CR, a processing block 11 in which various kinds of processing stations each for performing predetermined processing for the wafers W one by one in an SOD coating process are multi-tiered at predetermined positions, and a cabinet 12 in which a bottle of ammonia water, a bubbler, a drain bottle, and the like required in an aging process are provided are integrally connected.

In the cassette block 10, as shown in FIG. 1, a plurality of, for example, up to four wafer cassettes CR are mounted with respective wafer transfer ports facing the processing block 11 side at positions of projections 20a on a cassette mounting table 20 in a line in an X-direction. A wafer transfer body 21 movable in the direction of arrangement of cassettes (the X-direction) and in the direction of arrangement of wafers housed in the wafer cassette CR (a Z-vertical direction) selectively gets access to each of the wafer cassettes CR. The wafer transfer body 21 is structured to be rotatable in a θ-direction so as to be accessible to a transfer and chill plate (TCP) included in a multi-tiered station section of a third group G3 on the processing block 11 side as will be described later.

In the processing block 11, as shown in FIG. 1, a vertical transfer-type main wafer transfer mechanism 22 is provided in the center thereof. Around the main wafer transfer mechanism 22, all processing stations composing one group or a plurality of groups are multi-tiered. In this embodiment, four groups G1, G2, G3, and G4 each having multi-tiered stations are arranged. Multi-tiered stations of the first and second groups G1 and G2 are arranged side by side on the front side of the system (the lower side in FIG. 1), multi-tiered stations of the third group G3 are arranged adjacent to the cassette block 10, and multi-tiered stations of the fourth group G4 are arranged adjacent to the cabinet 12.

As shown in FIG. 2, in the first group G1, an SOD coating processing station (SCT) for supplying an insulating film material while the wafer W is mounted on a spin chuck in a cup CP and applying a uniform insulating film material on the wafer by rotating the wafer and a solvent exchange processing station (DSE) for supplying chemicals for exchange such as HMDS, heptane, and the like while the wafer W is mounted on a spin chuck in a cup CP and exchanging a solvent in the insulating film applied on the wafer for another solvent prior to a drying process are two-tiered from the bottom in order.

In the second group G2, an SOD coating processing station (SCT) is arranged at the upper tier. Incidentally, it is possible to arrange an SOD coating processing station (SCT), a solvent exchange processing station (DSE), or the like at the lower tier of the second group G2 if necessary.

As shown in FIG. 3, in the third group G3, two low-oxygen and high-temperature heat processing stations (OHP), a low temperature heat processing station (LHP), two cooling processing stations (CPL), a transfer and chill plate (TCP), and a cooling processing station (CPL) are multi-tiered from the top in order. The low-oxygen and high-temperature heat processing station (OHP) here has a hot plate on which the wafer W is mounted inside a sealable processing chamber, exhausts air from the center of the top portion of the processing chamber while $N_2$ is being discharged uniformly from holes at the outer periphery of the hot plate, and performs high-temperature heat processing for the wafer W in a low-oxygen atmosphere. The low-temperature heat processing station (LHP) has a hot plate on which the wafer W is mounted and performs low-temperature heat processing for the wafer W. The cooling processing station (CPL) has a chill plate on which the wafer W is mounted and performs cooling processing for the wafer W. The transfer and chill plate (TCP) has a two-tiered structure with a chill plate for cooling the wafer W at the lower tier and a delivery table at the upper tier and performs transfer of the wafer W between the cassette block 10 and the processing block 11.

In the fourth group G4, a low-temperature heat processing station (LHP), two low-oxygen curing and cooling processing stations (DCC), and an aging processing station (DAC) are multi-tiered from the top in order. The low-oxygen curing and cooling processing station (DCC) here has a hot plate and a chill plate so that they are adjacent to each other inside a sealable processing chamber, and performs high-temperature heat processing for the wafer W in the low-oxygen atmosphere in which exchange for $N_2$ is performed and performs cooling processing for the wafer W which has been subjected to heat processing. The aging processing station (DAC) introduces a processing gas ($NH_{3+H_2O}$) made by mixture of ammonia gas that is alkaline gas and water vapor into a sealable processing chamber to perform aging processing for the wafer W, whereby an insulating film material film on the wafer W is wet gelled.

Figure 4:
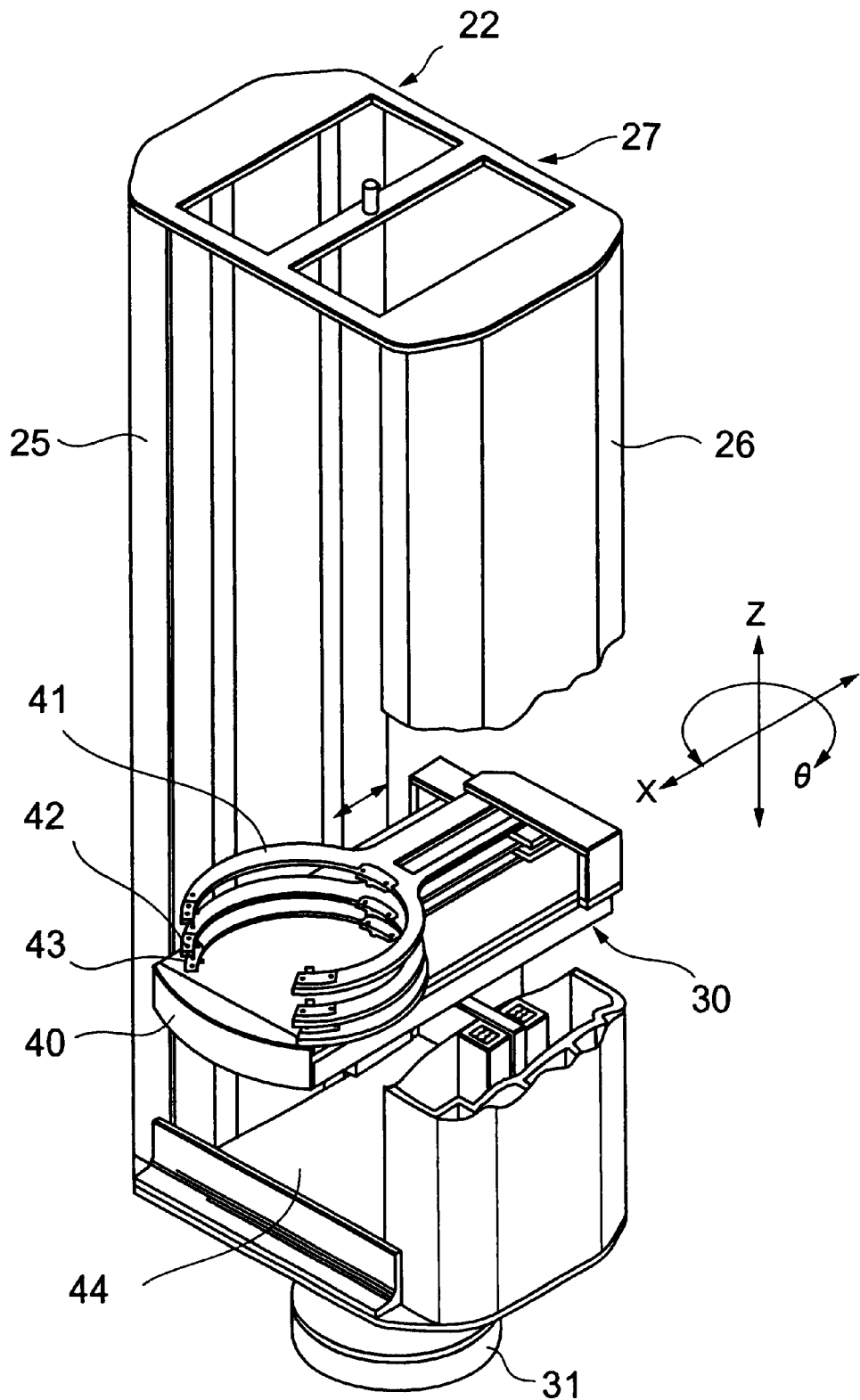
FIG. 4 is a perspective view of a main wafer transfer mechanism in the SOD processing system shown in FIG. 1.

FIG. 4 is a perspective view showing the appearance of the main wafer transfer mechanism 22. This main wafer transfer mechanism 22 is provided with a wafer transfer device 30 which is ascendable and descendable in the vertical direction (the Z-direction) inside a cylindrical supporter 27 composed of a pair of wall portions 25 and 26 which are connected with each other at respective upper ends and lower ends and face each other. The cylindrical supporter 27 is connected to a rotating shaft of a motor 31 and rotates integrally with the wafer transfer device 30 around the aforesaid rotating shaft by rotational driving force of the motor 31. Accordingly, the wafer transfer device 30 is rotatable in the θ-direction. For example, three tweezers are provided on a transfer base 40 of the wafer transfer device 30. These tweezers 41, 42, and 43 each have a shape and a size capable of freely passing through a side opening 44 between both the wall portions 25 and 26 of the cylindrical supporter 27 so as to be movable back and forth in the X-direction. The main wafer transfer mechanism 22 allows the tweezers 41, 42, and 43 to get access to processing stations disposed thereabout to transfer the wafer W from/to each of these processing stations.

Figure 5:
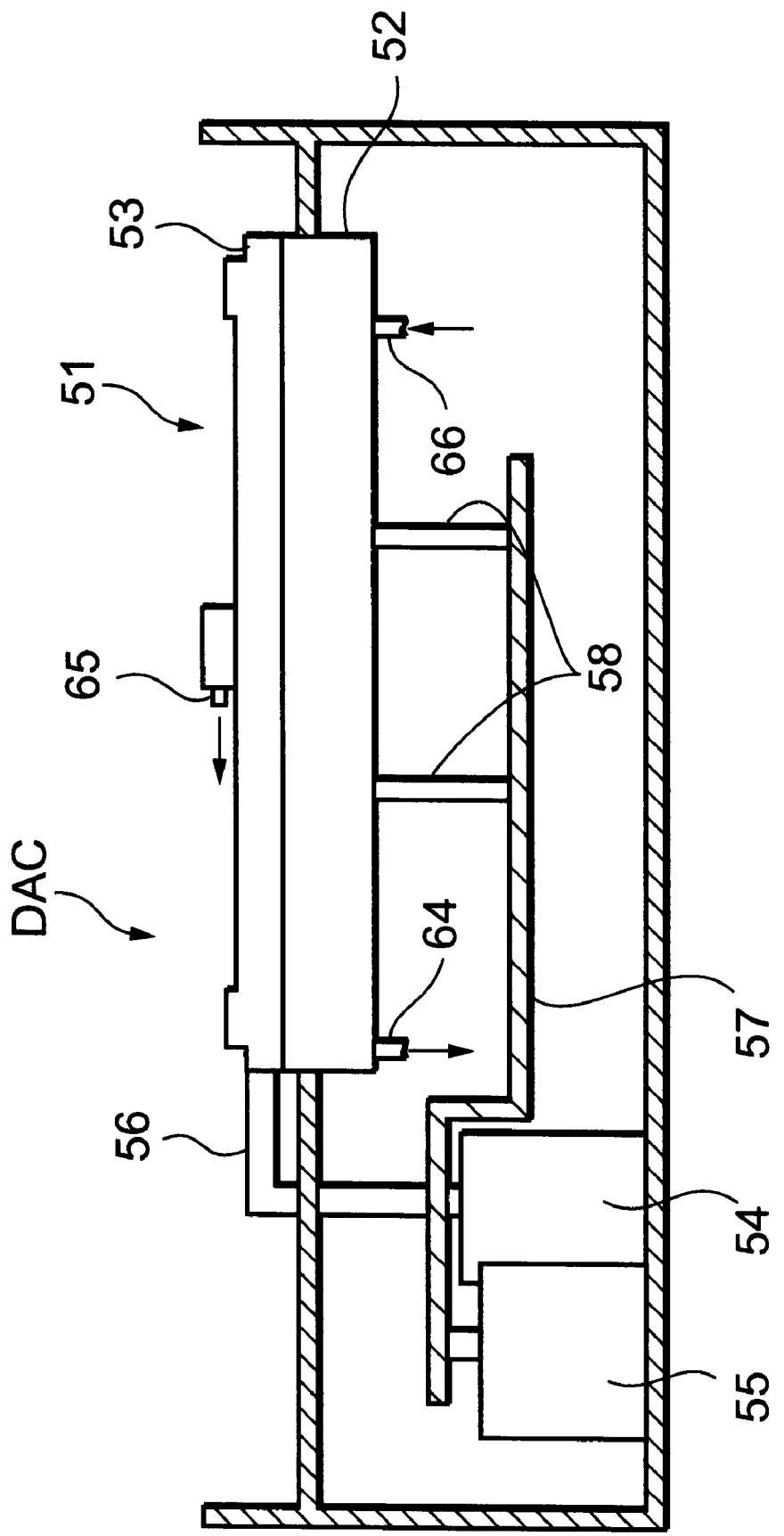
FIG. 5 is a sectional view of an aging processing station according to the embodiment of the present invention.
Figure 6:
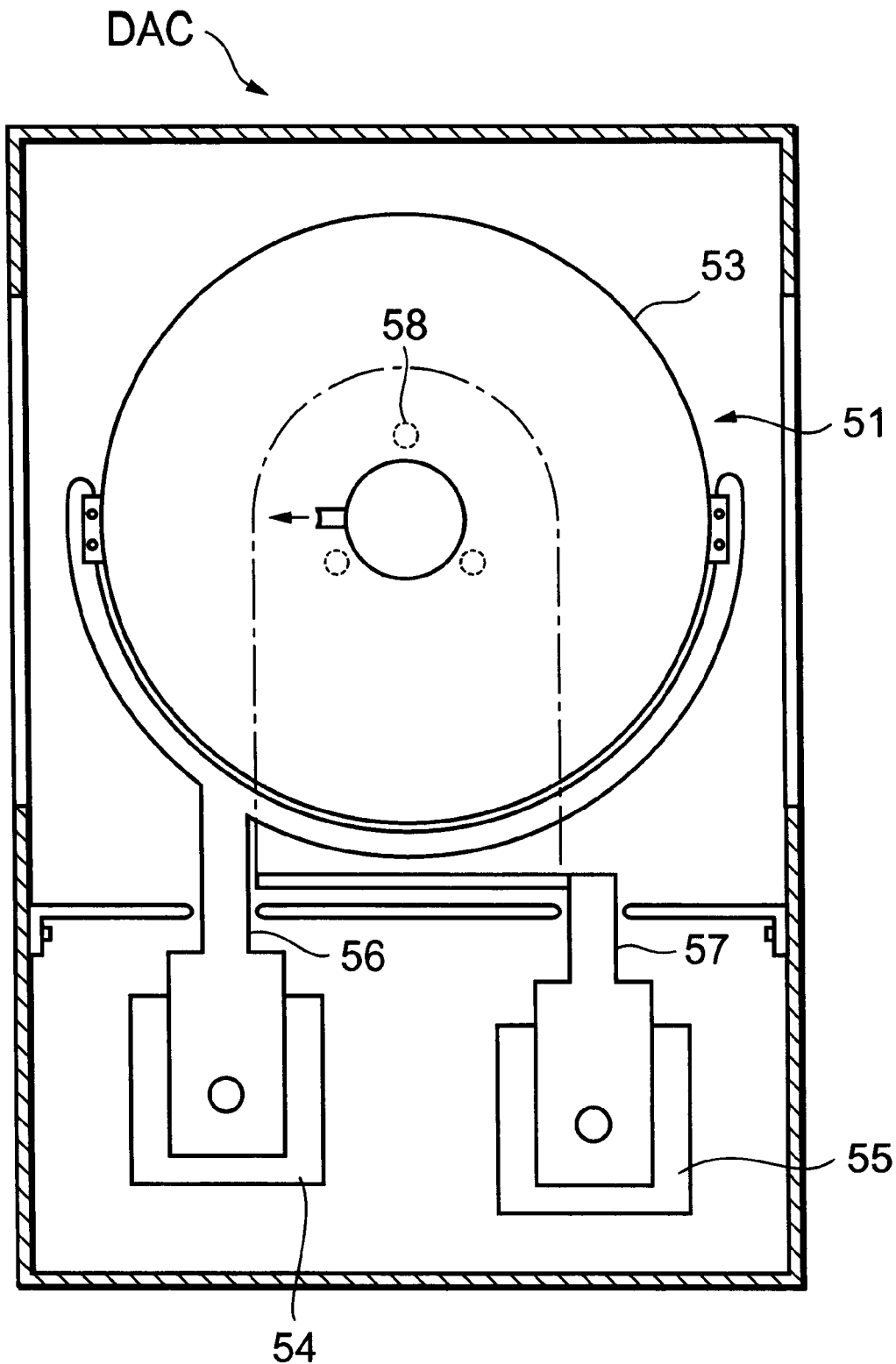
FIG. 6 is a plan view of the aging processing station shown in FIG. 5.
Figure 7:
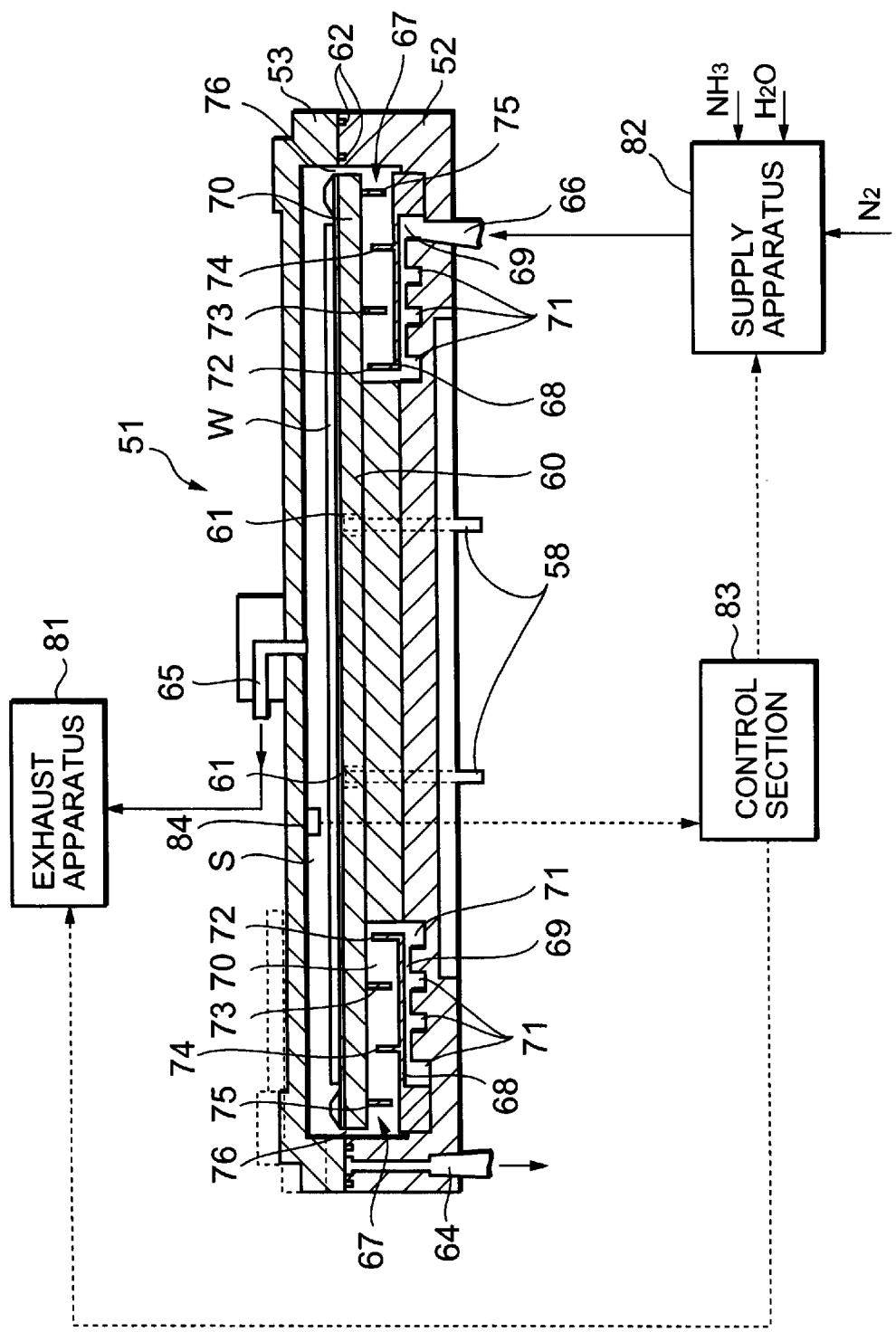
FIG. 7 is a sectional view of the processing chamber shown in FIG. 5 and FIG. 6.

FIG. 5 is a sectional view of the aforesaid aging processing station (DAC) and FIG. 6 is a plan view thereof. FIG. 7 is a sectional view showing the structure of the processing chamber in the aging processing station (DAC) and FIG. 8 is a plan view thereof.

As shown in FIG. 5 and FIG. 6, a processing chamber 51 is disposed at the center of the aging processing station (DAC). The processing chamber 51 includes a processing chamber main body 52 and a lid body 53 disposed to be ascendable and descendable with respect to the processing chamber main body 52. Further, two raising and lowering cylinders 54 and 55 so as to be adjacent to the processing chamber 51. The raising and lowering cylinder 54 is connected with the lid body 53 through a support member 56 to vertically drive the lid body 53. Furthermore, the raising and lowering cylinder 55 is connected with three support pins 58 described later through a support member 57 to vertically drive the support pins 58.

Figure 8:
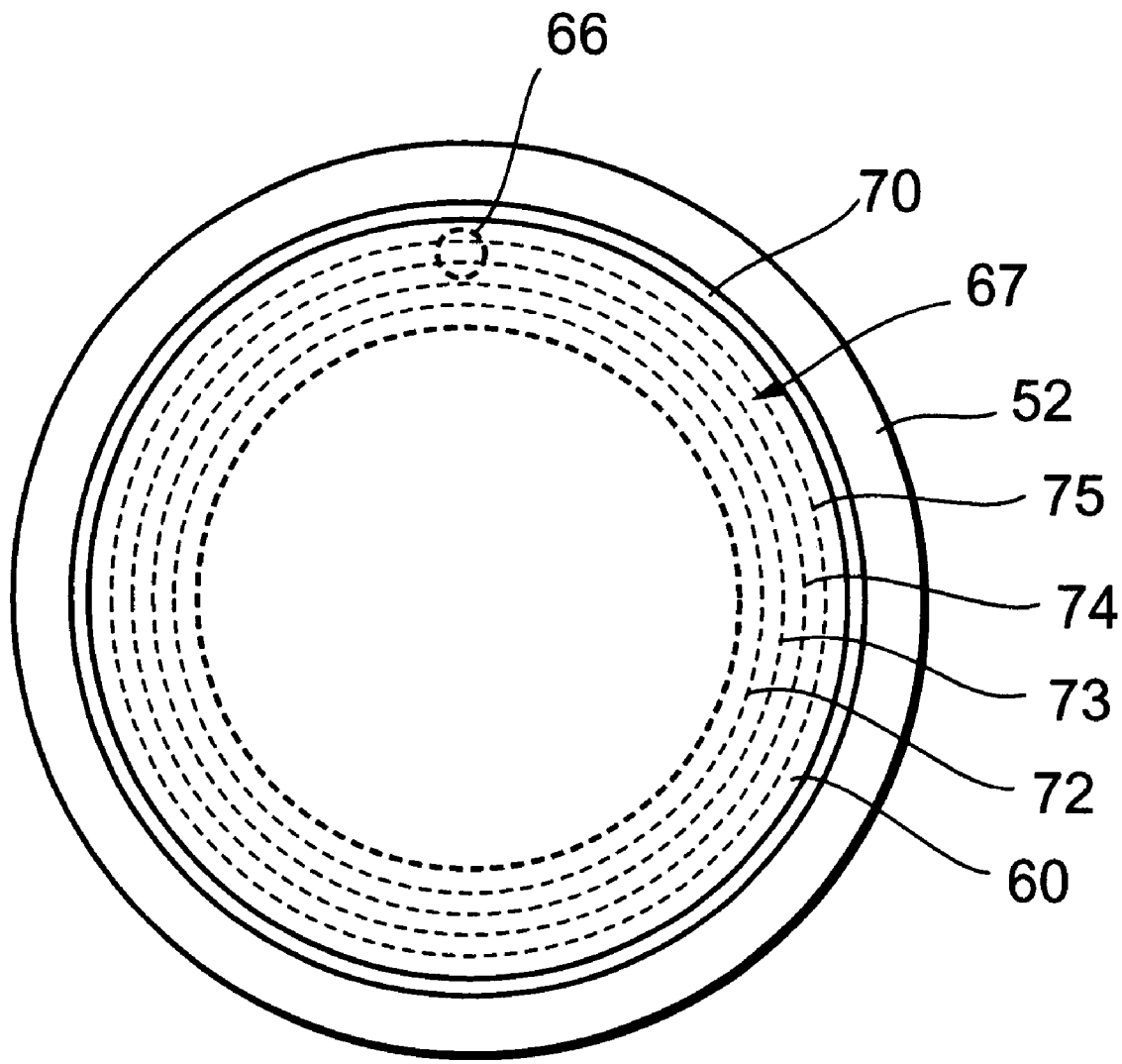
FIG. 8 is a plan view of the processing chamber shown in FIG. 7.

As shown in FIG. 7 and FIG. 8, a hot plate 60 is disposed at almost the center of the processing chamber main body 52. In the hot plate 60, a heater of which the illustration is omitted is embedded therein. The hot plate 60 is configured to be heated to a temperature for performing aging processing by the heater, for example, approximately 100° C. Further, for example, three holes are provided from a front face to a rear face of the hot plate 60 on a concentric circle. Each of the aforesaid support pins 58 is disposed in each hole 61 to be protrude and retract from/into the front face of the hot late 60. The support pins 58 transfer the wafer W from/to the main wafer transfer mechanism 22 while protruding from the front face of the hot plate 60. After receiving the wafer W from the main wafer transfer mechanism 22, the support pins 58 lower and retract into the hot plate 60, whereby the wafer W is mounted on the hot plate 60, which allows the wafer W to undergo heat processing. Further, proximity sheets 62a for holding the wafer W while the wafer W is lifted off the hot plate 60 without closely contacting the top of the hot plate 60 are disposed at a plurality of, for example, six points in the outer peripheral portion of a wafer W mounting position on the front face of the hot plate 60. Each of the proximity sheets 62a extends toward the outside of the wafer W mounting position, and guides 63 for guiding the wafer W are disposed at positions to which the respective proximity sheets 62a extend.

Further, as described above, the lid body 53 is disposed above the processing chamber main body 52 to be ascendable and descendable. Sealing members 62 are disposed in a face of the outer periphery of the processing chamber main body 52 which is closely attached to the lid body 53, and a plurality of suction holes 64 connected to a vacuum suction apparatus of which the illustration is omitted are provided in the closely-contact face. The suction holes 64 are vacuum-sucked with the lid body 53 being lowered, whereby the closely-contact face of the outer periphery of the lid body 53 is closely attached to the closely-contact face of the processing chamber main body 52 to form a sealed space S in the processing chamber 51. An exhaust hole 65 connected with an exhaust apparatus 81 is provided at the center of the lid body 53, that is, the central position above the hot plate 60.

A supply passage 66 connected to a supply apparatus 82 for supplying a processing gas and nitrogen ($N_2$) gas for purge into the processing chamber 51 is provided at an area close to the outer periphery on the rear face of the processing chamber main body 52. Along the inside of the outer periphery of the rear face of the hot plate 60 provided is a guide chamber 67 for temporarily storing the processing gas which is supplied from the supply apparatus through the supply passage 66 and guiding it from the outer edge of the hot plate 60 toward the front face of the hot plate 60.

A partition plate 68 for vertically partitioning the inside of the guide chamber 67 is provided in the guide chamber 67. The aforesaid supply passage 66 is provided outside a bottom face of a lower chamber 69 which is partitioned by the partition plate 68, and the lower chamber 69 communicates with an upper camber 70, which is partitioned by the partition plate 68, at the inner side of the lower chamber 69.

The bottom face of the lower chamber 69 is provided with, for example, four annular guide grooves 71 for guiding the processing gas, which is supplied from the supply apparatus, along the outer periphery of the rear face of the hot plate 60. Further, the upper chamber 70 is provided with, for example, four annular guide plates 72 to 75 for guiding the processing gas, which is supplied from the supply apparatus, along the outer periphery of the rear face of the hot plate 60. The guide plate 72 which is disposed at the innermost periphery is placed on the partition plate 68 and has a clearance between the guide plate 72 and the rear face of the hot plate 60. The next guide plate 73 is placed on the rear face of the hot plate 60 and has a clearance between the guide plate 73 and the partition plate 68. The next guide plate 74 is placed on the partition plate 68 and has a clearance between the guide plate 74 and the rear face of the hot plate 60. The guide plate 75 placed at the outermost periphery is placed on the rear face of the hot plate 60 and has a clearance between the guide plate 75 and the partition plate 68. Further, a clearance 76 is provided between the inner periphery of the processing chamber main body 52 and the outer edge of the hot plate 60 so that the processing gas and nitrogen ($N_2$) gas for purge are supplied from the guide chamber 67 to the front face of the hot plate 60 through the clearance 76.

A control section 83 controls operations of the aforesaid exhaust apparatus 81, the supply apparatus 82, and the like. For example, the exhaust apparatus 81 is controlled in exhaust amount, and the supply apparatus 82 is controlled in introduction amount (introduction pressure) of the processing gas and nitrogen gas to be supplied and in ratio of water vapor of the processing gas to be supplied. The exhaust amount of the exhaust apparatus 81 and the introduction amounts of the processing gas and nitrogen gas of the supply apparatus 82 are controlled, thereby controlling the pressure in the processing chamber 51. A heater is embedded in the supply apparatus 82, and nitrogen gas and water which are introduced into the supply apparatus 82 are temperature-controlled by the heater and supplied as a processing gas. The adjustment of the ratio of water vapor in the processing gas is performed by the temperature control by the heater.

Further, a pressure sensor 84 for detecting a pressure in such a processing chamber 51 is disposed in the processing chamber 51, so that a detected result by the pressure sensor 84 is reported to the control section 83.

Figure 9:
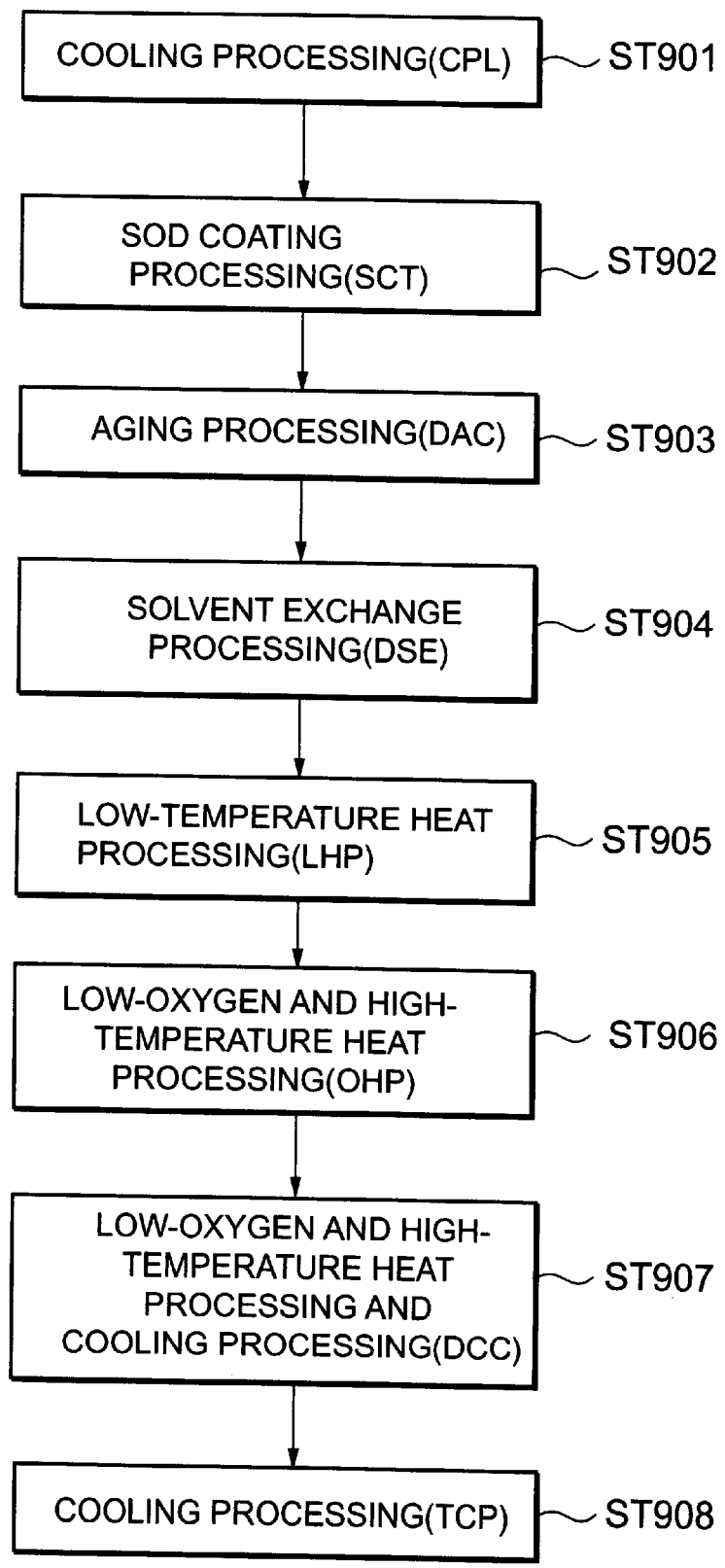
FIG. 9 is a processing flowchart of the SOD processing system shown in FIG. 1.

Next, operations in the SOD processing system 1 thus structured will be explained. FIG. 9 shows a processing flow in this SOD processing system 1.

First, in the cassette block 10, an unprocessed wafer W is transferred from the wafer cassette CR to the delivery table in the transfer and chill plate (TCP) included in the third group G3 on the processing block 11 side by means of the wafer transfer body 21.

The wafer W transferred to the delivery table in the transfer and chill plate (TCP) is transferred to the cooling processing station (CPL) by means of the main wafer transfer mechanism 22. In the cooling processing station (CPL), the wafer W is cooled to a temperature suitable for processing in the SOD coating processing station (SCT) (STEP 901).

The wafer W which has undergone the cooling processing in the cooling processing station (CPL) is transferred to the SOD coating processing station (SCT) via the main wafer transfer mechanism 22. In the SOD coating processing station (SCT), the wafer W is subjected to SOD coating processing (STEP 902).

The wafer W which has undergone the SOD coating processing in the SOD coating processing station (SCT) is transferred to the aging processing station (DAC) via the main wafer transfer mechanism 22. In the processing chamber 51 of the aging processing station (DAC), the support pins 58 receives the wafer W from the main wafer transfer mechanism 22 while protruding from the front face of the hot plate 60. Next, the support pins 58 lower, whereby the wafer W is mounted on the hot plate 60 and the lid body 53 lowers, whereby the closely-contact face of the outer periphery of the lid body 53 is closely attached to the closely-contact face of the processing chamber main body 52 to form a sealed space S in the processing chamber 51. Then, the processing gas is supplied from the supply apparatus 82 into the sealed space S in the processing chamber 51 through the supply passage 66.

Figure 10:
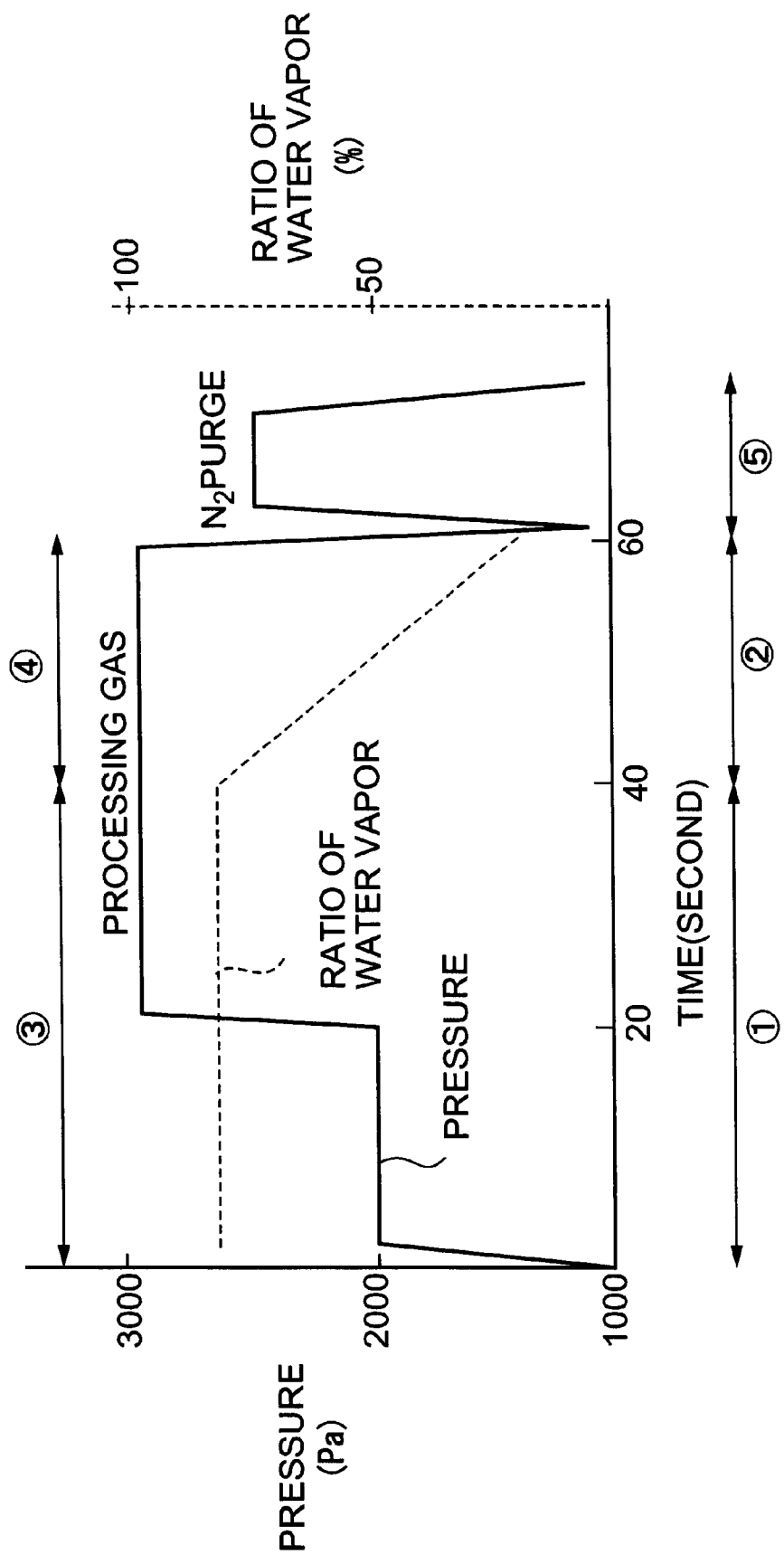
FIG. 10 is a graph showing changes in pressure in a processing chamber with time when a processing gas is supplied into the processing chamber and thereafter nitrogen gas is supplied and changes in ratio of water vapor contained in the processing gas which is introduced into the processing chamber with time in an aging processing station (DAC) in the SOD processing system shown in FIG. 1.

FIG. 10 is an example showing changes in pressure in the processing chamber with time when the processing gas is supplied into the processing chamber 51 and thereafter nitrogen gas is supplied and changes in ratio of water vapor contained in the processing gas which is introduced into the processing chamber 51 with time.

As described above, the exhaust amount of the exhaust apparatus 81 and the introduction amount of the processing gas of the supply apparatus 82 are controlled, whereby, for example, first the sealed space S in the processing chamber 51 is pressurized from normal pressure to 2000 Pa that is a first pressure, and this state is maintained, for example, for about 20 seconds. (period of ① in FIG. 10).

Thereafter, the sealed space S in the processing chamber 51 is pressurized from 2000 Pa to, for example, 3000 Pa that is a second pressure, and this state is maintained, for example, 40 seconds (period of ② in FIG. 10).

Here, when, for example, 40 seconds has elapsed since the aforesaid processing was started (period of ③ in FIG. 10), the ratio of water vapor contained in the processing gas which is introduced into the processing chamber 51 is decreased, and thereafter the ratio is kept to be decreased over about 20 seconds (until completion of processing by the processing gas) (period of ④ in FIG. 10). It is preferable that, for example, the ratio of water vapor is about 100% to about 80% for about 40 seconds since the processing was started and the ratio of water vapor is finally decreased to about 60% to about 40%.

Through the aforesaid periods of ① and ②, the wafer W in the processing chamber 51 is subjected to aging processing by the processing gas, whereby an insulating film material on the wafer W is gelled (STEP 903).

As described above, in this embodiment, since the ratio of water vapor contained in the processing gas is kept to be comparatively large, for example, for about 40 seconds from start of the processing, it is accelerated for collides of TEOS to be gelled and chained in a network form, resulting in a reduction in time required for the aging processing. Further, since water is sufficiently supplied, water spreads over the entire face of the wafer, and water functions as a heat transmission medium for transmitting heat from the hot plate to the wafer, so that heating is uniformly performed for the wafer W. As described above, the ratio of water vapor in the processing gas is decreased after the gelling proceeds to some extent, so that a water content in the coating film which is produced by the gelling is reduced. As a result, a processing time of the processing for exchanging water in the coating film for another solvent in the solvent exchange processing station (DSE) described later can be shortened, whereby a total processing time can be shortened. It should be noted that the process in the solvent exchange processing station (DSE) can be omitted depending on the insulating film material. Since it is necessary to remove water in the coating film even in this case, a water content in the coating film is reduced in amount, whereby a time required to remove water in the coating film is shortened and thus a total processing time can be shortened.

Further, the inside of the processing chamber 51 is brought to the first pressure higher than normal pressure, for example, about 2000 Pa, for about 20 seconds after the processing gas is introduced into the processing chamber 51 and thereafter the inside of the processing chamber 51 is brought to the second pressure higher than the first pressure, for example, about 3000 Pa, so that a layer insulating film with a desirable film thickness can be formed on the wafer W without occurrence of projections and depressions on the surface and additionally the processing time can be shortened.

Then, to prevent ammonium gas to diffuse, the sealed space S in the processing chamber 51 is temporarily returned to normal pressure and nitrogen gas is supplied from the supply apparatus 82 to the sealed space S in the processing chamber 51 for 10 seconds to purge the sealed space S in the processing chamber 51 by the nitrogen gas (period of ⑤ in FIG. 10).

Next, the lid body 53 is raised and the support pins 58 are raised to deliver the wafer W to the main wafer transfer mechanism 22.

The wafer W which has undergone the aging processing in the aging processing station (DAC) is transferred to the solvent exchange processing station (DSE) via the main wafer transfer mechanism 22. In the solvent exchange processing station (DSE), a chemical for exchange is supplied to the wafer W and processing for exchanging a solvent in the insulating film applied on top of the wafer for another solvent is performed (STEP 904).

The wafer W which has undergone the exchange processing in the solvent exchange processing station (DSE) is transferred to the low-temperature heat processing station (LHP) by means of the main wafer transfer mechanism 22. In the low-temperature heat processing station (LHP), the wafer W undergoes low-temperature heat processing (STEP 905).

The wafer W which has undergone the low-temperature heat processing in the low-temperature heat processing station (LHP) is transferred to the low-oxygen and high-temperature heat processing station (OHP) by means of the main wafer transfer mechanism 22. In the low-oxygen and high-temperature heat processing station (OHP), the wafer W undergoes high-temperature heat processing in a low-oxygen atmosphere (STEP 906).

The wafer W which has undergone the high-temperature heat processing in the low-oxygen and high-temperature heat processing station (OHP) is transferred to the low-oxygen curing and cooling processing station (DCC) by means of the main wafer transfer mechanism 22. In the low-oxygen curing and cooling processing station (DCC), the wafer W undergoes high-temperature heat processing in a low-oxygen atmosphere and then cooling processing (STEP 907).

The wafer W subjected to the processing in the low-oxygen curing and cooling processing station (DCC) is transferred to the chill plate in the transfer and chill plate (TCP) by means of the main wafer transfer mechanism 22. The wafer W undergoes cooling processing on the chill plate in the transfer and chill plate (TCP) (STEP 908).

The wafer W which has undergone the cooling processing on the chill plate in the transfer and chill plate (TCP) is transferred to the wafer cassette CR via the wafer transfer body 21 in the cassette block 10.

Incidentally, the present invention is not limited to the aforesaid embodiment and can be modified variously.

For example, the pressure may be frequently varied during the period of ② in FIG. 10. Thereby, the processing time can be further shortened.

Figure 11:
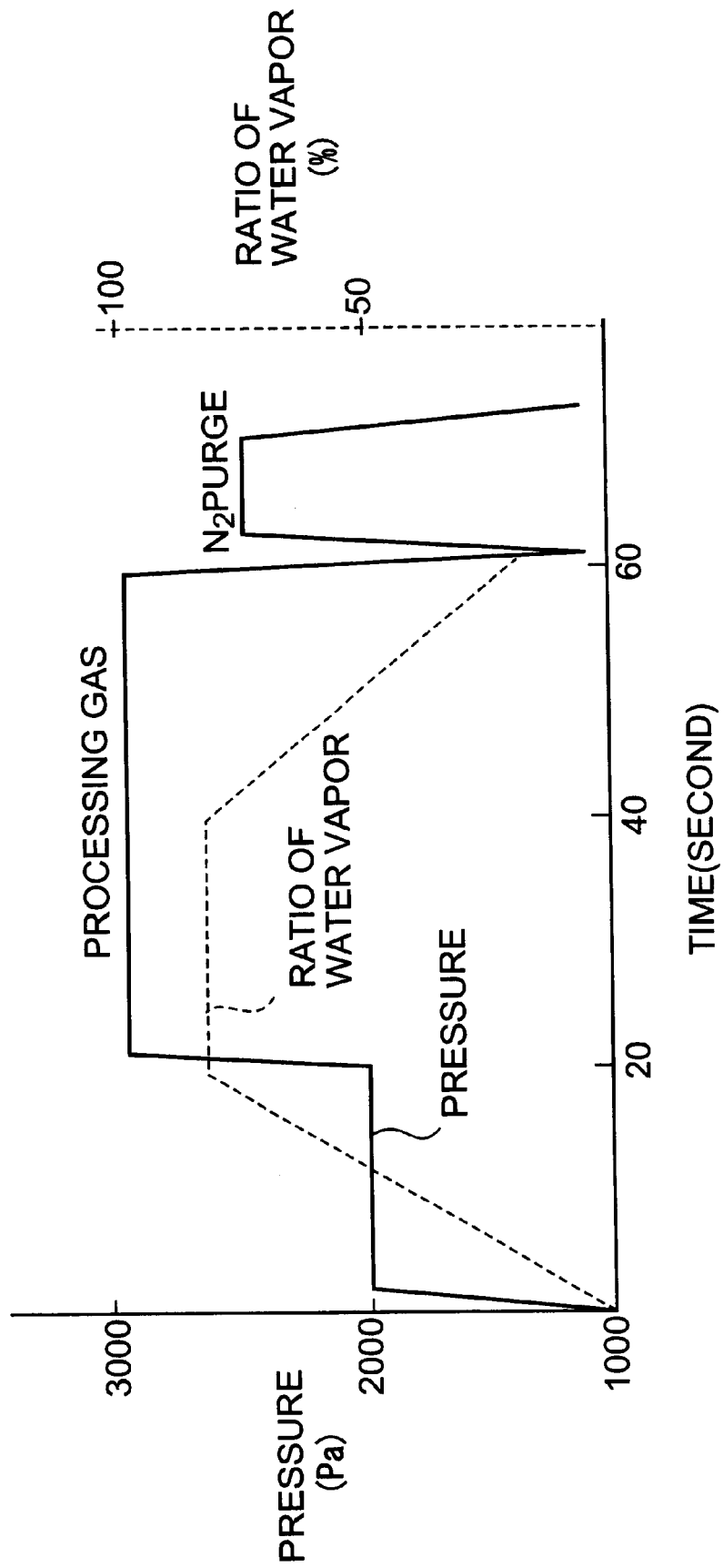
FIG. 11 is a graph showing changes in pressure in a processing chamber with time and changes in ratio of water vapor contained in a processing gas which is introduced into the processing chamber with time according to another embodiment in the aging processing station (DAC)

Furthermore, a certain amount of processing gas is supplied from the beginning in the aforesaid embodiment, but the supply amount of the processing gas may be gradually increased as shown in FIG. 11. The pressure is gradually changed as above, thereby efficiently vaporizing the ammonium gas and the water vapor in the processing gas not to make them into ammonia water.

Figure 12:
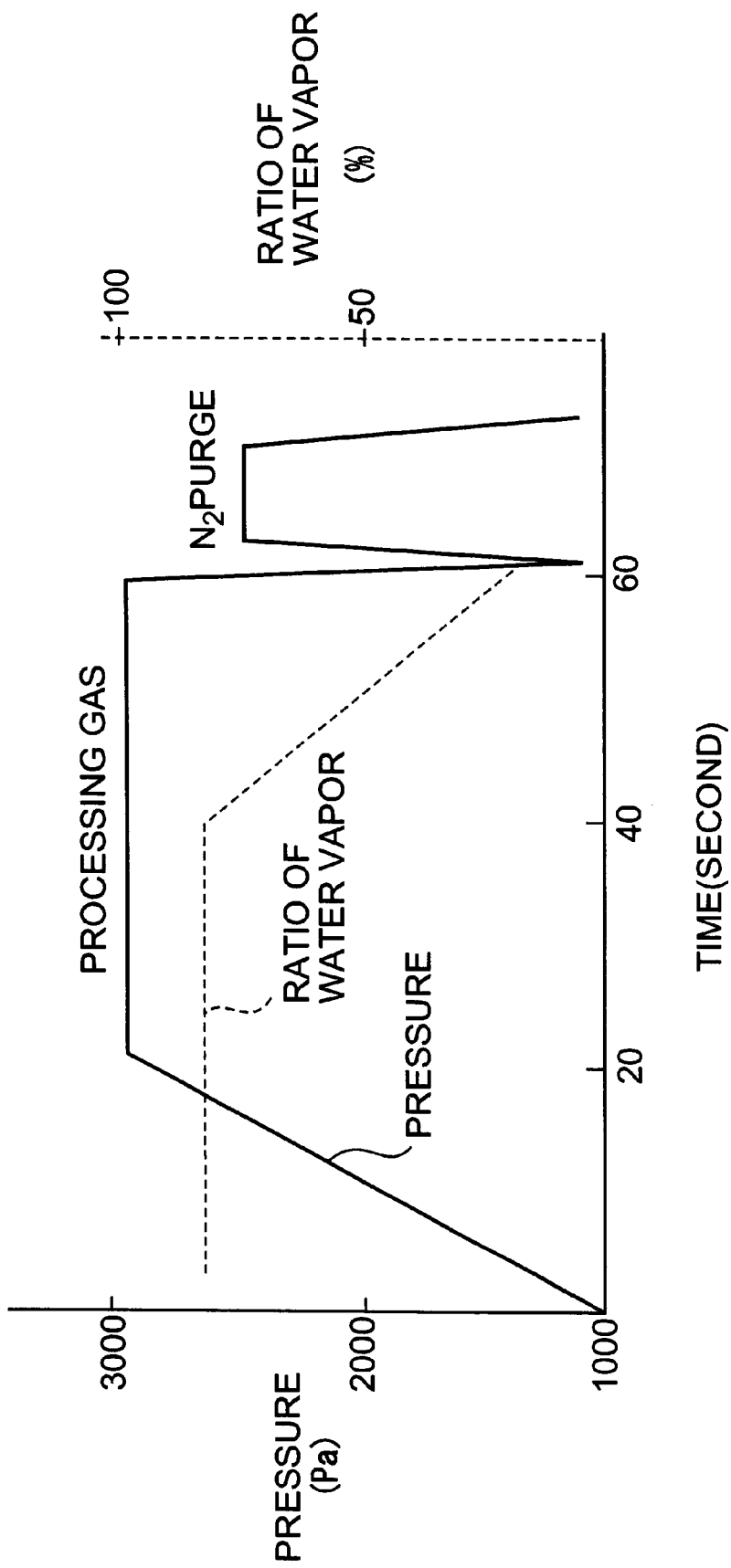
FIG. 12 is a graph showing changes in pressure in a processing chamber with time and changes in ratio of water vapor contained in a processing gas which is introduced into the processing chamber with time according to still another embodiment in the aging processing station (DAC)

Moreover, in the aforesaid embodiment, the pressurizing from normal pressure to 3000 Pa is performed in steps. The performance of pressurizing in steps brings about a situation in which the pressurizing is performed after the film quality becomes stable, so that an insulating film excellent in film quality can be obtained. However, the pressure is not changed in steps as above, but the pressure may be gradually changed as shown in FIG. 12.

Figure 13:
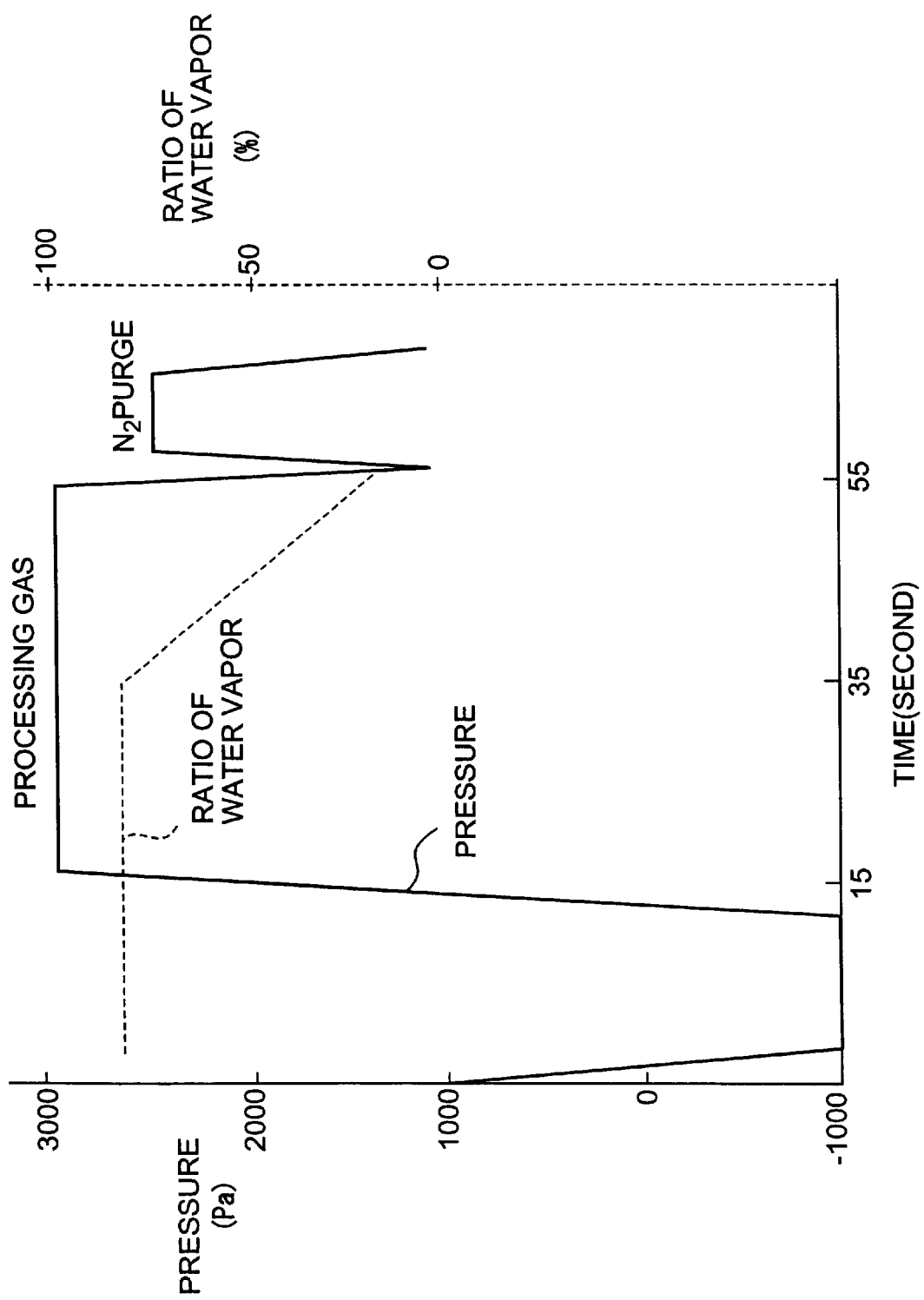
FIG. 13 is a graph showing changes in pressure in a processing chamber with time and changes in ratio of water vapor contained in a processing gas which is introduced into the processing chamber with time according to still another embodiment in the aging processing station (DAC)

Further, the pressurization from normal pressure to 3000 Pa is performed in the aforesaid embodiment, but it is suitable to perform a temporary reduction from normal pressure to, for example, −1000 Pa and then pressurization to 3000 Pa as shown in FIG. 13. The inside of the processing chamber is brought to the reduced pressure at first as described above, whereby the time for the processing gas to fill the processing chamber can be reduced. For example, as compared with the aforesaid embodiment, the processing time can be reduced by about five seconds.

Figure 14:
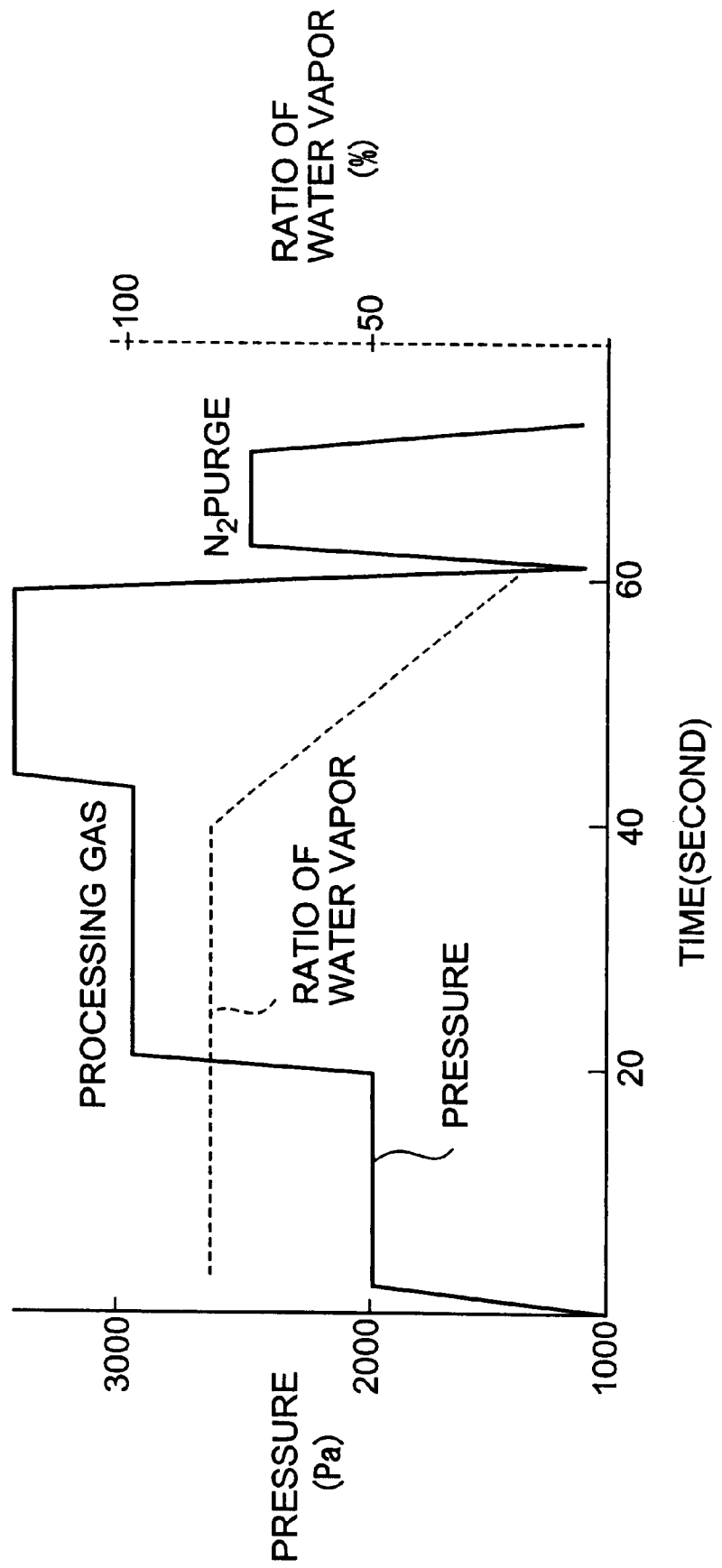
FIG. 14 is a graph showing changes in pressure in a processing chamber with time and changes in ratio of water vapor contained in a processing gas which is introduced into the processing chamber with time according to still another embodiment in the aging processing station (DAC).

Further, though the pressure in the processing chamber is increased in two steps in the aforesaid embodiment, the pressure in the processing chamber may be increased in three steps as shown in FIG. 14, so that the processing time can be further reduced.

Furthermore, the aging processing time and the supply state of water vapor may be adjusted as necessary depending on the insulating film material. The processing gas to be supplied with a temperature of, for example, 30° C. to 40° C. is used, but the temperature of the processing gas may be adjusted as necessary in accordance with the insulating film material.

Moreover, there is a material that shrinks with increase in temperature, resulting in reduced film. In the case of using such an insulating film material, it is necessary to bring the processing gas during the aging processing time to a low temperature, and it is possible to incorporate cooling means capable of cooling to, for example, 20° C. in place of the heater in the supply apparatus 82 in the aforesaid embodiment. As the cooling means, a temperature controlling water with a temperature, for example, close to a set temperature is allowed to indirectly pass through. Ammonia water is stored in the apparatus including such cooling means and ammonia gas is allowed to bubble in the ammonia water, whereby ammonia gas containing water vapor as the processing gas can be produced.

In the present invention, a substrate to be processed is not limited to a semiconductor wafer, and other substrates such as an LCD substrate and the like are also suitable. Moreover, the kind of a film is not limited to a layer insulating film.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing method, comprising the steps of:

heating a substrate while a processing gas made by mixture of an alkaline gas and water vapor is introduced into a processing chamber in which the substrate is placed; and decreasing a ratio of water vapor in the processing gas after a lapse of a predetermined period of time from the processing gas is introduced into the processing chamber.

2. The method as set forth in claim 1, wherein the inside of the processing chamber has a pressure higher than normal pressure.

3. The method as set forth in claim 2, wherein the inside of the processing chamber is brought to a first pressure higher than normal pressure for a predetermined period of time after the processing gas is introduced into the processing chamber and then the inside of the processing chamber is brought to a second pressure higher than the first pressure.

4. The method as set forth in claim 3, wherein the inside of the processing chamber is brought from the second pressure to a state close to normal pressure after a lapse of a predetermined period of time from the ratio of water vapor in the processing gas is decreased.

5. The method as set forth in claim 4, wherein the inside of the processing chamber is exchanged for an inert gas after the inside of the processing chamber is brought from the second pressure to the state close to normal pressure.

6. The method as set forth in claim 1, wherein the substrate is coated with a coating solution in which particles or colloids are dispersed in a solvent, and wherein the alkaline gas mixed in the processing gas is ammonia gas.

7. The method as set forth in claim 6, wherein the particles or colloids are made of TEOS.

8. The method as set forth in claim 1, wherein the processing gas is introduced into the processing chamber with the amount thereof being gradually increased.

9. The method as set forth in claim 1, wherein the inside of the processing chamber is gradually pressurized.

10. The method as set forth in claim 1, wherein the inside of the processing chamber is reduced in pressure to be lower than normal pressure and thereafter pressurized to be higher than normal pressure.

11. The method as set forth in claim 1, wherein the inside of the processing chamber is exchanged for an inert gas after a lapse of a predetermined period of time from the ratio of water vapor in the processing gas is decreased.

12. A substrate processing method, comprising the steps of:

introducing an alkaline processing gas with water into a processing chamber in which a substrate coated with a coating solution in which particles or colloids are dispersed in a solvent is placed; and decreasing a ratio of water vapor in the processing gas after a lapse of a predetermined period of time from the processing gas is introduced into the processing chamber.

13. The method as set forth in claim 12, wherein the processing gas is made by mixing ammonia gas and water vapor.

14. The method as set forth in claim 12, wherein the particles or colloids are made of TEOS.

15. The method as set forth in claim 12, further comprising the step of:

removing the solvent in the coating film which has been processed by the processing gas.

16. The method as set forth in claim 12, further comprising the step of:

exchanging the solvent in the coating film which has been processed by the processing gas for another solvent.

17. The method as set forth in claim 16, further comprising the step of:

removing the exchanged other solvent.

* * * * *